United States Patent

Kurian et al.

Patent Number: 5,164,687
Date of Patent: Nov. 17, 1992

[54] COMPACT LUMPED CONSTANT NON-RECIPROCAL CIRCUIT ELEMENT

[75] Inventors: Thampy Kurian, Stow; Leo Maloratsky, Brookline, both of Mass.

[73] Assignee: Renaissance Electronics Corp., Stow, Mass.

[21] Appl. No.: 716,524

[22] Filed: Jun. 17, 1991

[51] Int. Cl.⁵ .......................................... H01P 1/387
[52] U.S. Cl. ................................. 333/1.1; 333/24.2
[58] Field of Search ............................ 333/1.1, 24.2

[56] References Cited

U.S. PATENT DOCUMENTS 3,573,665  4/1971  Knerr ................................. 333/1.1
3,895,320  7/1975  Katoh ................................ 333/1.1
4,855,694  8/1989  Ogawa ............................... 333/1.1

Primary Examiner—Paul Gensler

[57] ABSTRACT

A lumped circulator/isolator element including option with widebanding circuit, in which an inductor is used, at the same time, as one plate of a capacitor creating a capacitance to a ground plane. Three-strip spiral inductors 3 each located in between three strip conductors 1 on a surface of a ferrite substrate 5 at 60 degree angle to each other with a common junction point in a center of the ferrite substrate 5. A capacitance of the inductors 3 is created to the ground plane 6.

3 Claims, 3 Drawing Sheets

COMPACT LUMPED CONSTANT NON-RECIPROCAL CIRCUIT ELEMENT

FIELD OF INVENTION

The invention herein presented relates to compact lumped constant non-reciprocal circuit elements such as circulators and isolators for use in VHF, UHF and microwave frequency bands including broad-band application.

BACKGROUND OF THE INVENTION

Considering progress in thin-film lumped-element integrated circuits construction and technology, expansion of lumped elements application in communication industry (cellular telephone), and common trend to miniaturization of lumped-element-related circuits, the overall dimensions and better adaptability to manufacture of the lumped elements are becoming their most important commercial characteristics. It is especially important for the circuits with low resonance frequency (f), where inductance (L) and capacitance (C) of the lumped elements should be high enough, according to the well-known relationship of $$f = \frac{1}{2\pi\sqrt{LC}},$$

and therefore the influence of the parameters L and C on dimensions and fabrication of the elements is much higher.

In a conventional lumped element circular/isolator L is created by the so-called junction inductor which is in shunt connection with a separate capacitor (see, for example, the U.S. Pat. No. 4,812,787). Because of this shunt connection of the two separate entities (inductor and capacitor) the room in a circuit should be provided for both of these entities. Also, labor should be provided in order to produce those two entities, to put them in a circuit and to connect them with the rest of the circuitry.

It leads to lower level of integration of the circuit as well. The necessity to provide labor both for capacitor and inductor leads to higher fabrication cost.

It is desirable for a lumped circuit element to combine both L and C in the same entity, without any separation and connection. It is also desirable that the element mentioned would have higher reliability compared with the state-of-the art lumped elements. It is further desirable that the lumped circuit element would have low fabrication cost.

SUMMARY OF THE INVENTION

The invention herein presented is a compact lumped constant non-reciprocal circuit element comprising a set of three mutually insulated high impedance strip conductors and a set of three strip spiral inductors, a ferrite substrate with flat top and bottom parallel surfaces, a magnetic circuit with permanent magnet including ground plane which is setting up a magnetic flux in said ferrite substrate, wherein said conductors and said spiral inductors are symmetrically located in consecutive order with inductors in between conductors on the top surface of said ferrite substrate at 60 degree angle to each other having a common junction point in a center of said ferrite substrate, said conductors each provided with an I/O port at each end, said ground plane is located on a bottom surface of the ferrite substrate creating capacitance to said spiral inductors where said ground plane and said spiral inductors work as plates, and said ferrite substrate works as a dielectric filling of a flat capacitor. Said spiral inductors each having a set of gaps for tuning.

Compared with traditional lumped elements, the present invention is providing both inductor and capacitor as the same entity. Because of this the level of integration of the circuit and its reliability is much higher. The lumped elements, according to the invention, will have lower fabrication cost because of the lack of necessity to provide connection between inductor and capacitor and put each of them in a circuitry.

DRAWINGS

DETAILED DESCRIPTION

Figure 1:
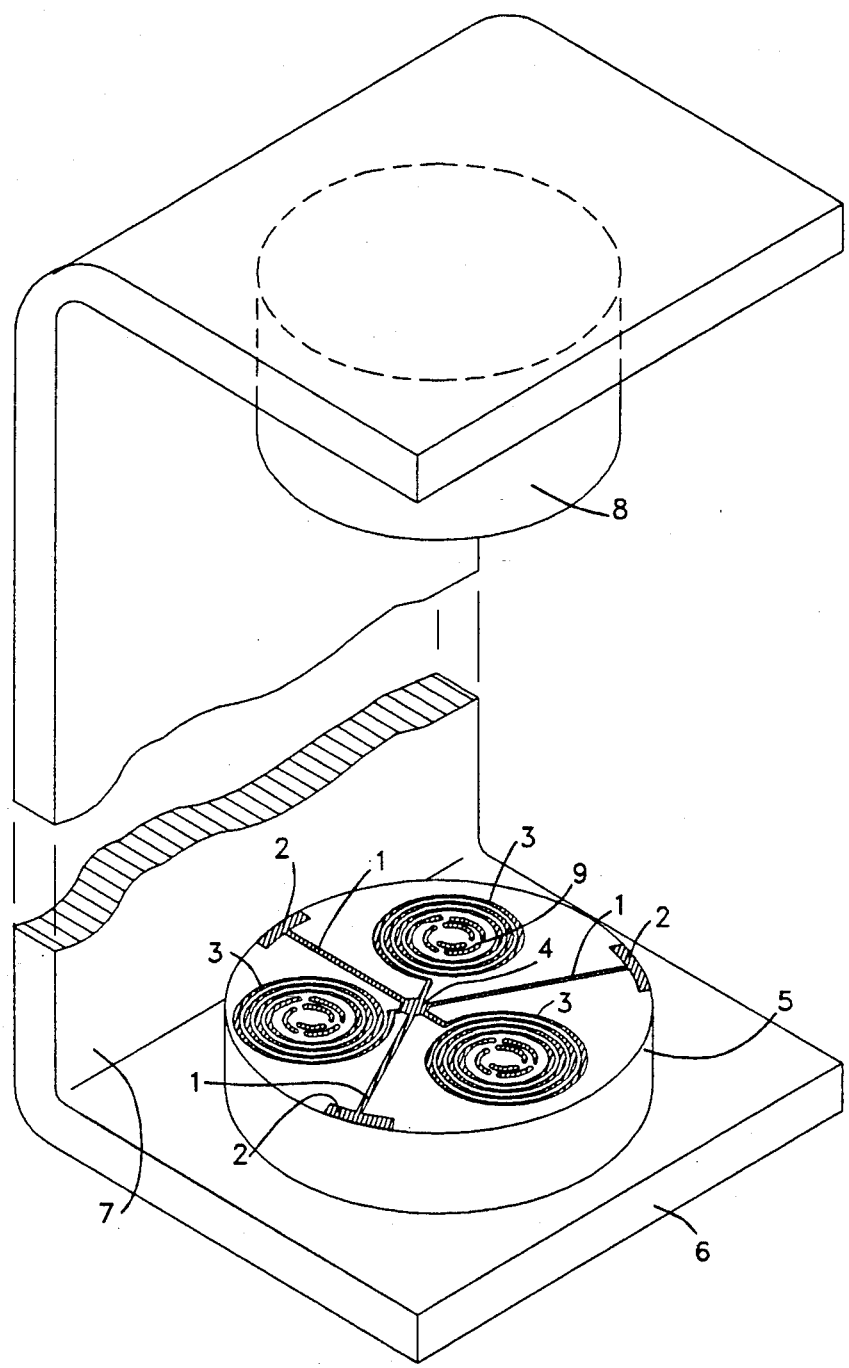
FIG. 1 is an isometric view of the main embodiment of the lumped element according to the present invention (part of the casing and some details are not shown for clarity)

Referring to the drawings, FIG. 1 shows a compact lumped constant non-reciprocal circuit element comprised of a set of three mutually isolated high impedance strip conductors I, each having a port 2 at its end, and of a set of three strip spiral inductors 3. Both conductors I and inductors 3 have common junction point 4 at the center of the circuit they compose, which is located on the top surface of a ferrite substrate 5. Conductors I and inductors 3 are located symmetrically in consecutive order with inductors in between conductors at 60 degree angle to each other.

Both top and bottom surfaces of the ferrite substrate 5 are flat and parallel to each other. A bottom surface of the ferrite substrate 5 is laid on a ground plane 6, which is a portion of a magnetic circuit comprising casing 7 and permanent magnet 8. This magnetic circuit sets up a magnetic flux in the ferrite substrate 5. A portion of each inductor 3 is interrupted by gaps 9 for the possibility of tuning the lumped element.

When this lumped element works, the inductors 3 create L and, at the same time, they serve as upper plate of a capacitor having ground plane 6 as lower plate and ferrite substrate 5 as a dielectric filler. Thus, because of the C of inductors 3 to the ground plane 6, the lumped element, according to the invention, does not have any need for a separate capacitor, creating both L and C within a single entity.

Figure 2:
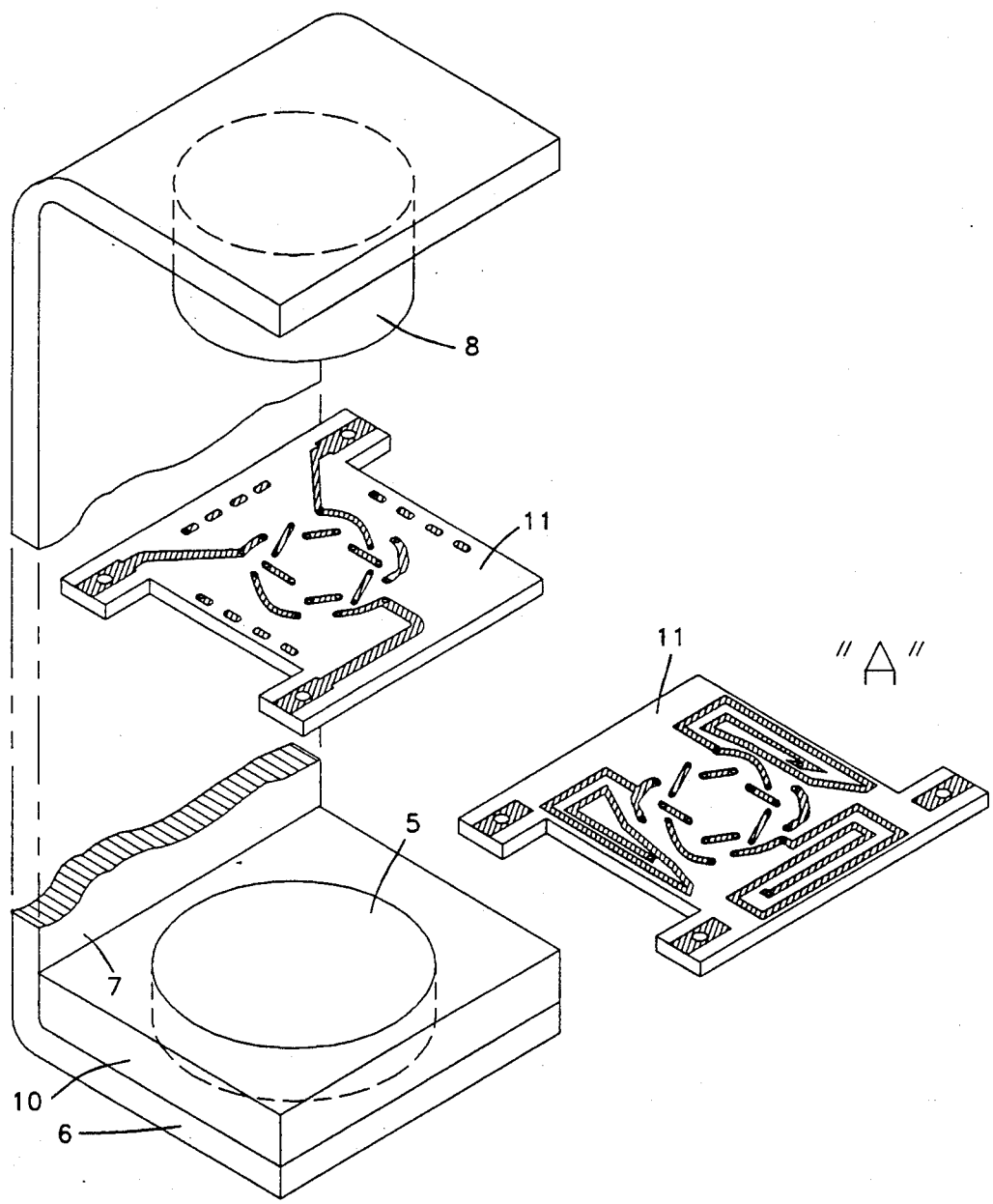
FIG. 2 is an isometric view of the lumped element according to the present invention with optional dielectric substrates, where view "A" is a back side of the upper dielectric substrate.

It has to be understood that the general idea of the invention herein described, and the implementation might be modified in different ways. For example, in order to diminish dimensions of the expensive ferrite substrate 5 and, at the same time, to increase the C parameter of the lumped element, the ferrite substrate 5 might be put in a dielectric substrate-filler 10 (FIG. 2) having higher dielectric constant compared with a ferrite as an example to show the possibilities to use different topologies of inductances on both sides of the dielectric substrate 11. In this option of the invention the circuit of the lumped element should be applied on a dielectric substrate 11 (using both substrate's sides) with the most portion of the strip spiral inductors 3 located outside the ferrite substrate 5 area and within the dielectric substrate-filler 10 area.

Figure 3:
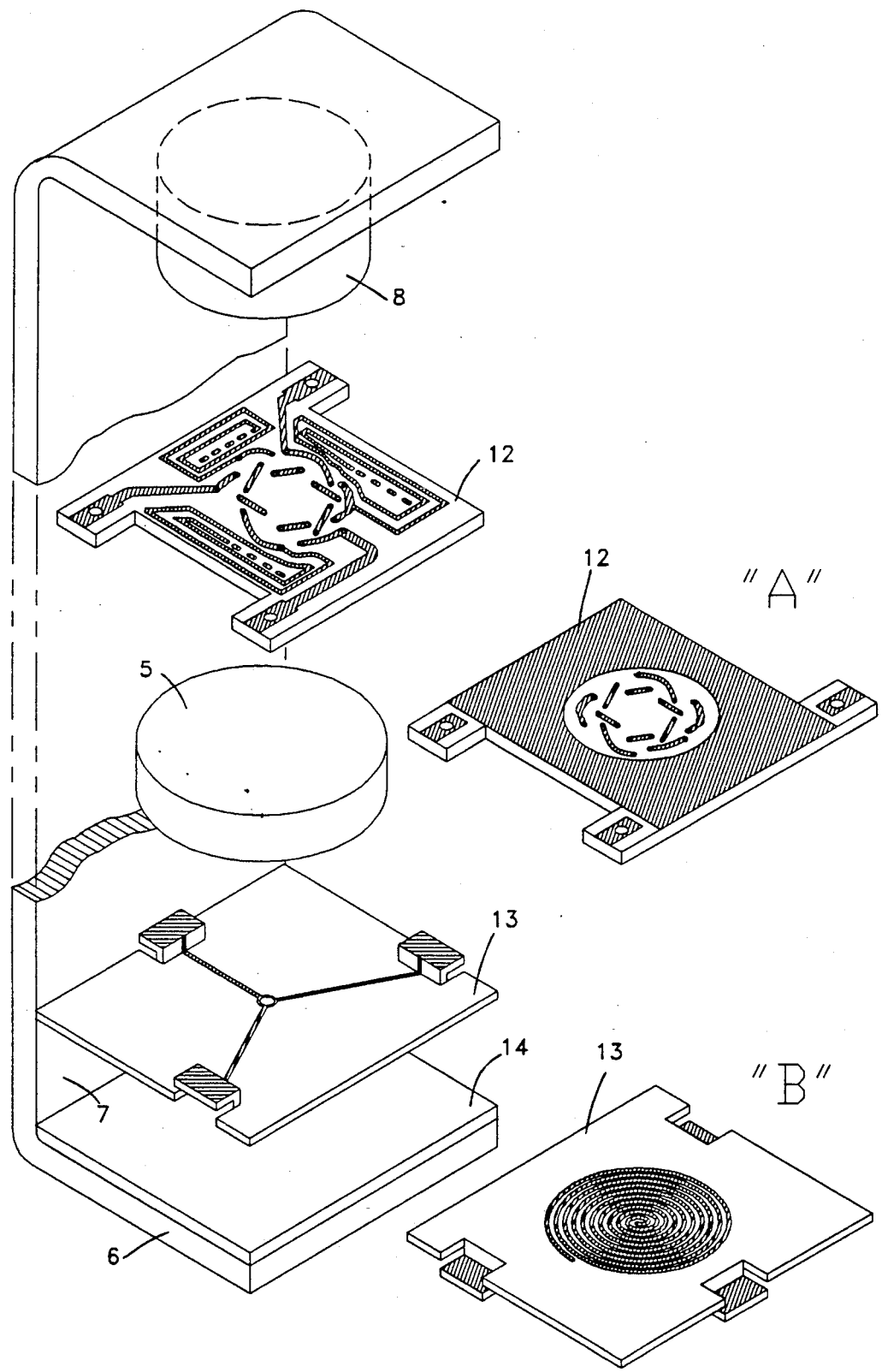
FIG. 3 is an isometric view of the lumped element according to the present invention with optional widebanding circuit, where view "A" is a back side of the dielectric substrate with circulator/isolator circuit, and view "B" is a back side of the dielectric substrate with widebanding circuit.

The concept of this invention might also be used in order to create a broad band circulator/isolator lumped element (FIG. 3). In this case two dielectric substrates and a dielectric filler should be used. A top surface at the upper dielectric substrate 12 and both sides of the substrate 11 on FIG. 2 have identical circuits. On the bottom surface of the dielectric substrate 12 there is a metal plate which serves like a ground plane 6 of the main embodiment of the invention. In this option the inductors on the top surface of the substrate 12 and the metal plate on its bottom surface work as plates of a capacitor with the dielectric substrate 12 working as a dielectric filler of the capacitor.

A widebanding circuit in this lumped element is located on the second dielectric substrate 13 of the element with the ferrite substrate 5 in between those two substrates (12 and 13). Under the substrate 13 is located a dielectric filler 14 which is laid on the upper surface of the ground plane 6. It is easy to see that a strip spiral inductor of the circuit on the dielectric substrate 13, the dielectric filler 14, and the ground plane 6 altogether also compose a capacitor. Thus, in this case the concept of the invention gives a possibility to create a widebanding circuit of a serial L-C connection as a single entity additionally to the usage of this concept in circulator/isolator circuit within the same lumped element. It means that the concept of the invention when it is used for a broad band element appears to be even more effective compared with its common application.

As one can see from the above description of the principal embodiment of the invention and of its different options, in each case the new concept provides better integration level, diminishing labor cost and increasing of the element reliability. All this is reached because of combination of inductor and capacitor within a single entity, causing decreasing of the quantity of parts and connections in the lumped elements according to the invention.

What is claimed is:

1. A compact lumped constant non-reciprocal circuit element comprising:
    a set of three mutually insulated high impedance strip conductors,
    a set of three strip spiral inductors,
    a ferrite substrate with flat top and bottom parallel to each other's surfaces,
    a magnetic circuit with permanent magnet including ground plane which is setting up a magnetic flux in said ferrite substrate,
    wherein said conductors and said spiral inductors are symmetrically located in consecutive order with inductors in between conductors on the top surface of said ferrite substrate at 60 degree angle to each other and having a common junction point in a center of said ferrite substrate, said conductors each provided with an input/output port on its end, said ground plane and said spiral inductors working as plates, and said ferrite substrate working as a dielectric filling of a flat capacitor.

2. The compact lumped constant non-reciprocal circuit element according to claim 1, wherein said spiral inductors each have a set of gaps for tuning.

3. The compact lumped constant non-reciprocal circuit element according to claim 1, where said circuit element is a circulator.

* * * * *